United States Patent [19]

Ito et al.

[11] Patent Number: 4,716,567

[45] Date of Patent: Dec. 29, 1987

[54] METHOD OF TRANSMITTING DIGITAL DATA IN WHICH ERROR DETECTION CODES ARE DISPERSED USING ALTERNATE DELAY TIMES

[75] Inventors: Masahiro Ito; Masaharu Kobayashi; Takao Arai, all of Yokohama, Japan

[73] Assignee: Hitachi, Ltd., Tokyo, Japan

[21] Appl. No.: 827,606

[22] Filed: Feb. 10, 1986

[30] Foreign Application Priority Data

Feb. 8, 1985 [JP] Japan ................................ 60-21651

[51] Int. Cl.⁴ ............................................. G06F 11/10
[52] U.S. Cl. ......................................... 371/40; 371/39
[58] Field of Search ........................ 371/40, 39, 38, 37

[56] References Cited

U.S. PATENT DOCUMENTS

| | | | |
|---|---|---|---|
| 4,541,091 | 9/1985 | Nishida | 371/39 |
| 4,562,577 | 12/1985 | Glover | 371/39 |
| 4,562,578 | 12/1985 | Odaka | 371/40 |
| 4,564,945 | 1/1986 | Glover | 371/40 |
| 4,586,183 | 4/1986 | Wilkinson | 371/40 |
| 4,618,955 | 10/1986 | Sharpe | 371/39 |

Primary Examiner—Michael R. Fleming
Attorney, Agent, or Firm—Antonelli, Terry & Wands

[57] ABSTRACT

In a method of transmitting digital data including the steps of constructing one block by a plurality of digital data, constructing one frame by a plurality of blocks, adding two kinds of mutually different error detection and correction codes to these blocks and transmitting these digital data together with the codes that are added, the digital data are not interleaved, only the error detection and correction codes are interleaved and these interleaved codes are added to the digital data.

2 Claims, 23 Drawing Figures

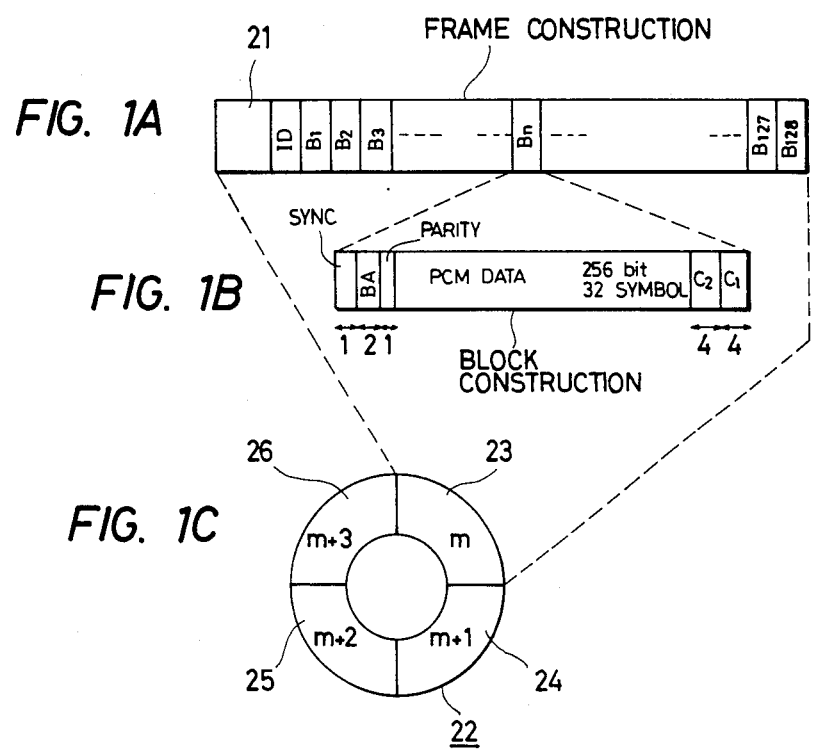

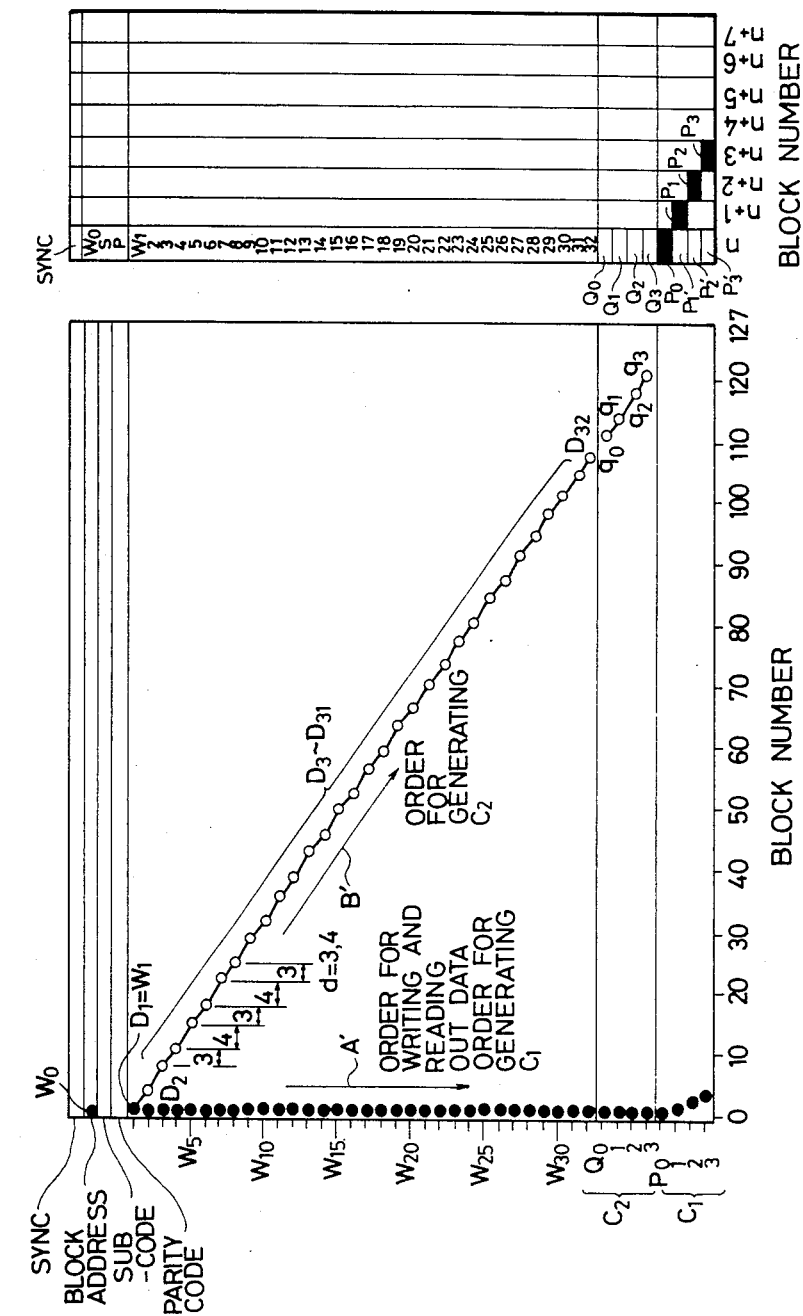

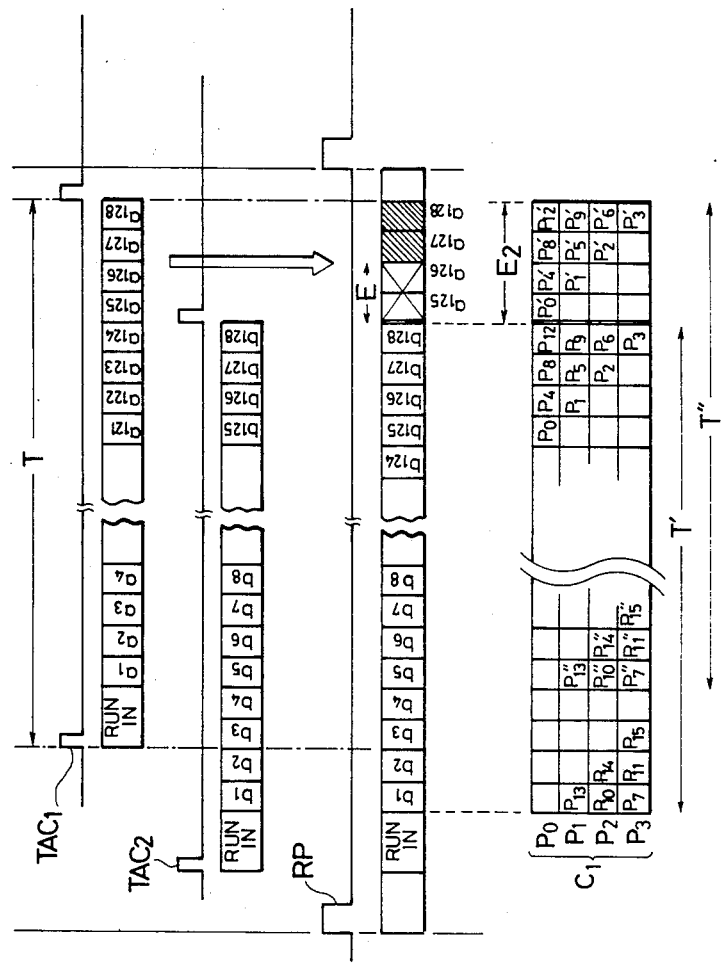

METHOD OF TRANSMITTING DIGITAL DATA IN WHICH ERROR DETECTION CODES ARE DISPERSED USING ALTERNATE DELAY TIMES

BACKGROUND OF THE INVENTION

This invention relates to a method of transmitting digital signals, and more particularly to a method of transmitting digital signals which is suitable for use in a recording and reproducing apparatus which effects after-recording by double recording.

Conventional recording and reproducing apparatuses of digital signals such as digital audio tape recorders employ a recording and reproducing method in which input data is interleaved in blocks of information, as disclosed, for example, in Japanese Patent Laid-Open No. 187039/1983. In apparatuses such as digital audio tape recorders, burst errors increase because the apparatuses effect high density recording. However, the recording and reproducing method described above converts the burst errors to random errors to improve the effect of error detection and correction codes, prevents preceding and subsequent data from simultaneously becoming errors even when correction of an error proves to be impossible, and makes approximation and interpolation by mean data of both the correct data. In the case of audio signals and video signals, the output signals after D/A conversion are not very offensive acoustically and visually.

In recording and reproducing apparatuses of digital signals such as floppy disks, however, an error of only one bit data results in a critical problem. Therefore, an omission of error detection and an erroneous detection must not by any means exist, and a method which changes the data such as mean value interpolation cannot be used.

Accordingly, it is customary in data recorders or the like to reduce the number of occurrence of errors by reducing the recording density in order to absolutely reduce the occurrence of error. For this reason, even if the recording and reproducing method by interleaving described above is employed, a digital signal processing circuit will become complicated in construction and large in scale so that not only the effective feature of the interleave cannot be used effectively but fresh problems occur.

The definite problems will now be described with reference to the case where an electronic camera (a still camera or a video floppy) system for recording still picture information on a floppy disk is used and digital data is recorded by this system in place of the picture, by way of example. (For the detail of the electronic camera, refer to Japanese Patent Laid-Open No. 84303/1984, for example. However, the problems to be described below are clarified as a result of studies made by the inventors of the present invention, and are not at all disclosed in the prior art reference described above.)

FIGS. 1A to 1C show recording formats for data recording of an electronic camera. FIG. 1A shows a frame construction. One frame consists of 128 blocks. Portion 21 corresponds to a head contact start position, and a burst signal or the like is recorded therein as a margin. An ID portion is an area in which ID codes for control other than input signals are added. FIG. 1B shows the construction of one block. Symbol Sync represents a sync signal, BA denotes a block address and sub-code, and Parity denotes a check code for detecting errors of the BA portion. This check code is, for example, a simple parity formed by effecting Mod 2-addition of the block address and the sub-code for each bit.

PCM data denotes an area which divides and records the input data into 32 samples (each sample consisting of 8 bits or 32 samples having 256 bits in all). $C_1$ and $C_2$ denote areas which record first and second codes for detecting and correcting errors of the PCM data. For example, a Reed-Solomon Code is generated and recorded.

FIG. 1C represents a magnetic sheet 22 called a "video floppy disk", and a method which divides the sheet 22 into four sectors 23~26 as shown in the drawing is employed.

FIG. 2 shows a memory map using the conventional interleave method. In the drawing, BLOCK corresponds to 1 block of data having the construction shown in FIG. 1, and S represents an area for storing the sync signal, the block address, the sub-code and check codes for detecting the errors of the block address and the sub-code. D denotes a memory area for storing the input PCM data, and $C_1$ and $C_2$ denote first and second error detection and correction codes for the PCM data.

In accordance with the conventional interleave method, each input data in time sequence is delayed and is stored at a position represented by an arrow B in the drawing. The second code $C_2$ is generated from the data positioned at the arrow B and is stored at a position of an arrow Q. Furthermore, the first code $C_1$ is generated from the PCM data and the code $C_2$ at a position of an arrow A, and is stored on the same block of the arrow A as represented by an arrow P. Here, the sync signal till the code $C_1$ of each block are read out in the sequence of the arrows A, P and in the sequence of the block number and are then recorded. Therefore, the input time sequence data and the code $C_2$ are interleaved in delay blocks as represented by the arrows B, Q and the code $C_1$, which is completed in one block data, is generated and recorded. In accordance with this interleave recording method, however, a problem develops when recording by double recording is effected.

FIGS. 3A-3D show the case where the problem described above develops. In the drawings, symbols $a_1$, $a_2$, $a_3$, ..., $a_{128}$ and $b_1$, $b_2$, $b_3$, ..., $b_{128}$ represent the blocks and their block numbers in each frame signal. Here, FIG. 3A shows the relation of position when the signal is recorded under a normal state, and the signal is recorded at a position T interposed by pulses $TAC_1$ that are generated by the rotation of the magnetic sheet. Let's consider the case where recording is deviated from a position T, at which the recording must be originally made, as shown in FIG. 3B when after-recording is made by double recording from above the recorded portion as shown in FIG. 3A. In this case, the signal after after-recording is as shown in FIG. 3C and the portion represented by E corresponds to the finish portion of the after-recording signals (FIG. 3B), and hence the old block data $a_{125}$, $a_{126}$ are assumed to be errors. In this case, $a_{127}$, $a_{128}$ are the old data, but do not prove to be the errors when check is made by use of the $C_1$ code, which is completed in one block data and is generated and recorded.

In order to detect also the signal that is after-recorded at a deviated position as shown in FIG. 3B at the time of reproduction, it is necessary to take in and process all the data contained in the area R including margins both before and after the area T. However, the new data $b_1$, $b_2$, $b_3$. . . , $b_{128}$ by after-recording and the old data $a_{125}$, $a_{126}$, $a_{127}$, $a_{128}$ that are left unerased, that is to say, the data for the 132 blocks, co-exist in this area R. Which 128 blocks among the 132 blocks which are generated by after-recording can not be discriminated from the result of detection by means of the $C_1$ code. In other words, there has been the problem that erroneous correction of errors is made by use of data of 128 blocks of combinations other than the combination $b_1$, $b_2$, $b_3$, . . . , $b_{128}$ such as a combination of 128 blocks of $b_5$, $b_6$, $b_7$, . . . , $b_{128}$ with $a_{125}$, $a_{126}$, $a_{127}$ and $a_{128}$. Therefore, the conventional apparatuses need a circuit and an apparatus for recording non-signals for a predetermined period as an after-recording margin as represented by an oblique line portion in FIG. 3D after recording is completed.

SUMMARY OF THE INVENTION

In digital signal recording and reproduction having check codes for error detection and correction, it is an object of the present invention to reduce the adverse influences due to unerased signals when after-recording by double recording is effected.

It is a further object of the present invention to improve the efficiency of the correction capability for correcting continuous errors caused by drop-out and the like.

It is another object of the present invention to provide a method of transmitting digital signals which eliminates the necessity of circuits and devices that have been necessary in the prior art technique in order to effect recording while securing an after-recording margin to make up for the unerased portions.

There objects can be accomplished by the present invention which provides a method of transmitting digital data, which comprises the steps of arranging digital data, that is to be transmitted, in a predetermined number unit in a digital data area inside each block in the sequence of the generation of these digital data; and generating a plurality of first check codes from a plurality of digital data existing inside the same block.

These and other objects and novel features of the present invention will become more apparent from the following description when taken in conjunction with the accompanying drawings.

BRIEF DESCRIPTION OF THE DRAWINGS

FIGS. 1A, 1B and 1C are format diagrams of a magnetic sheets showing a data recording method of an electronic camera;

FIGS. 4A and 4B are memory maps, each showing an embodiment of the transmission method in accordance with the present invention;

FIGS. 5A, 5B, 5C and 5D are conceptual views useful for explaining the effect of the present invention;

DESCRIPTION OF THE PREFERRED EMBODIMENTS

Figure 12:
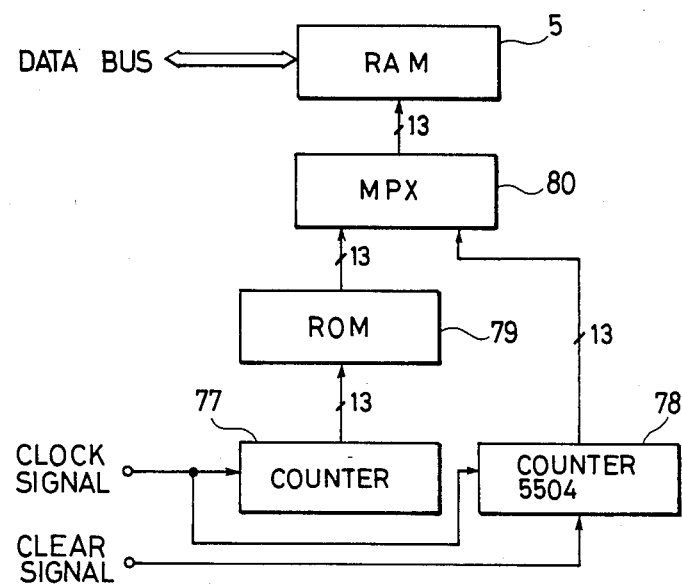
FIG. 12 is a block diagram showing another exmaple of the address control circuit for the memory realizing the recording method which utilizes the transmission method of the present invention.
Figure 2:
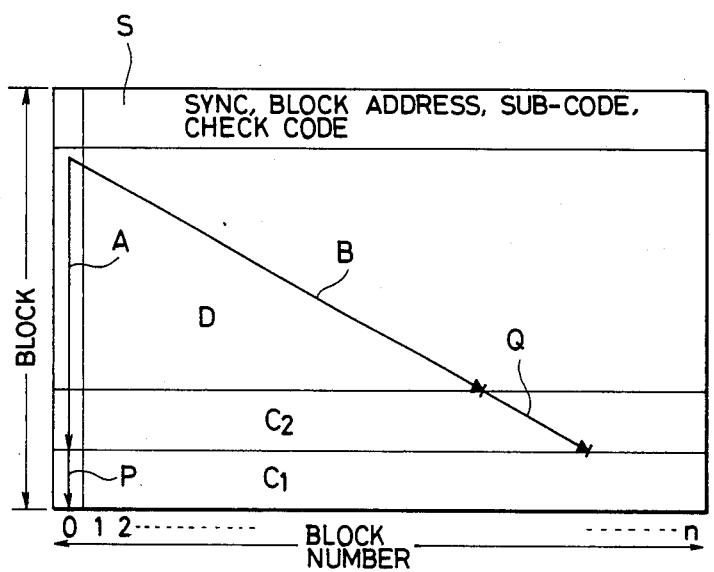
FIG. 2 is a memory map in a conventional transmission method and shows that each data is interleaved.

Hereinafter, a first embodiment of the present invention will be described with reference to FIGS. 4A and 4B. FIG. 4A is a memory map for generating or interleaving error detection and correction codes, and FIG. 4B is a partial enlarged view of FIG. 4A and corresponding to the block construction shown in FIG. 1B.

It is hereby assumed that input digital elements (samples) in time sequence are sequentially stored at positions represented by black circles $W_1 \sim W_{32}$ on the memory map in the order represented by an arrow $A'$. Then, $C_2$ codes $q_0 \sim q_3$ are generated in the order represented by an arrow $B'$ from 32 data elements at positions represented by white circles $D_1 \sim D_{32}$ in the diagram and are sequentially stored at the positions shown in the diagram. Here, the memory positions of the data elements $D_1 \sim D_{32}$ that generate the $C_2$ codes and the memory positions of the resulting $C_2$ codes $q_0 \sim q_3$ are non-linear so that the distance d of delay blocks between adjacent data takes alternately the value $d=3$ and the value $d=4$. This arrangement further enhances a dispersion effect in comparison with a mere delay method, and can improve the correction length of a burst error.

The data which generates the $C_1$ codes $P_0 \sim P_3$ are 37 in all, that is, the black circles $W_0 \sim W_{32}$ and the $C_2$ codes $Q_0 \sim Q_3$ in the diagram, and the $C_1$ codes $P_0 \sim P_3$ are generated in the sequence represented by the arrow $A'$. Furthermore, these $C_1$ codes $P_0 \sim P_3$ are stored at the positions $P_0 \sim P_3$ as seen in FIG. 4B, that is, at those positions at which the distance $d'$ of delay blocks between the adjacent data of $P_0 \sim P_3$ has a relation $d'=1$. The order for reading out these stored data elements so as to record them on a magnetic sheet is in the order represented by the arrow $A'$. For instance, the order is the sync signal Sync, the block address $W_0$, the subcode S, the parity code P, the data elements $W_1 \sim W_{32}$, the $C_2$ codes $Q_0 \sim Q_3$ and the $C_1$ codes $P_0$, $P'_1$, $P'_2$ and $P'_3$ in the nth block as seen in FIG. 4B. This means that the input time sequence data is read out and recorded in the input order without being interleaved. As to the $C_2$ codes, non-linear interleave of $d=3$ and $d=4$ is effected. As to the $C_1$ codes $P_0 \sim P_3$ of the four symbols, they are recorded in adjacent blocks so that the distance of delay blocks between the data of $P_0 \sim P_3$ is $d=3$ which is the minimum value of the distance d of the delay blocks for generating the $C_2$ codes. In other words, they are recorded while interleave is being applied so that the distance of delay blocks satisfies the relation $d'=1$. The $C_1$ code is completed in the four blocks.

When recording is effected by the method described above, the afore-mentioned problem can be solved without need for the after-recording margin. Next, this will be explained with reference to FIGS. 5A through 5D.

Figures 3A, 3B, 3C, 3D:
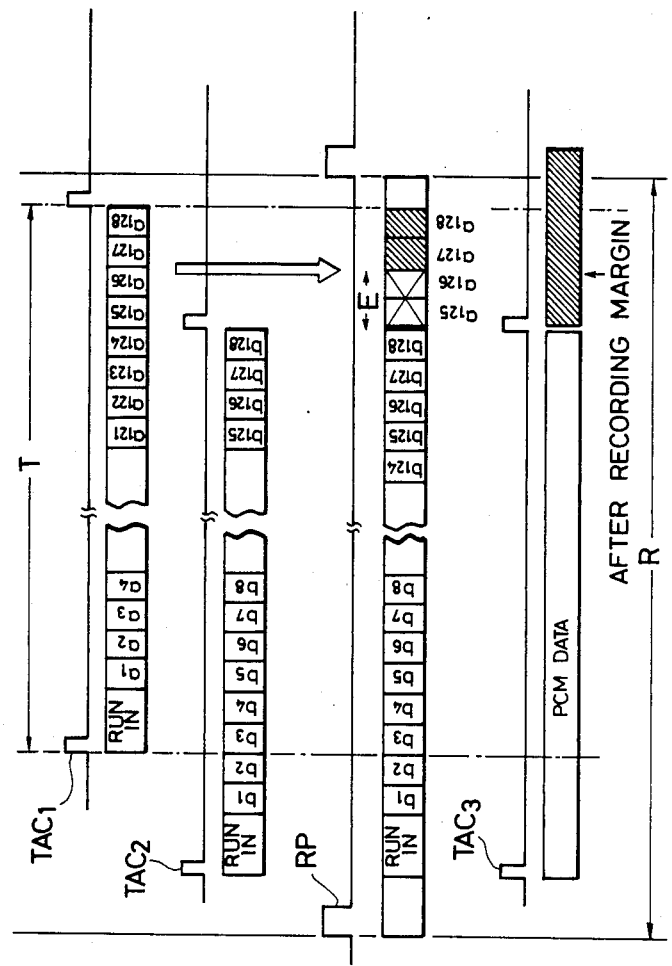
FIGS. 3A, 3B, 3C and 3D are conceptual views showing the problems encountered with a conventional transmission method.

In FIGS. 5A through 5C, like reference numerals are used to identify like constituents as in FIGS. 3A through 3C. Here, after-recording is effected while a pulse $TAC_2$ in under a deviated state, and unerased blocks $a_{125} \sim a_{128}$ are supposed to occur (with the proviso that $a_{125}$ and $a_{126}$ are error blocks). When $C_1$ code check is made in the area T' by detecting the deviation time of the pulse $TAC_2$, the data $W_0 \sim W_{32}$, $Q_0 \sim Q_3$ in the $b_{126}$ block, for example, and the data $P_4$, $P_5$, $P_6$, $P_7$ in FIG. 5D are all judged as correct if no code error is found by the $C_1$ check. However, if a circuit and apparatus for detecting and correcting the deviation time of the pulse $TAC_2$ is not provided, a check is made while assuming that the pulse $TAC_2$ is not deviated. Therefore, error detection by $C_1$ is made by use of the data of the area T''.

For example, in the case of the check by the data $W_0 \sim W_{32}$ in the $a_{127}$ block, $Q_0 \sim Q_3$ and $P''_8$, $P'_9$, $P''_{10}$, $P''_{11}$, the data $W_0 \sim W_{32}$, $Q_0 \sim Q_3$ and $P'_8$, $P'_9$ is unerased old data while the data $P''_{10}$, $P''_{11}$ is new data double-recorded by after-recording. Therefore, errors can naturally be detected by the $C_1$ check. Similarly, error is judged for the $a_{128}$ block, too. In other words, the data is all judged as error data in the $E_2$ area so that neither erroneous detection of errors nor erroneous correction of errors could occur. In addition, it becomes possible to detect the $E_2$ error which proves to be continuous error blocks and to check by use of the data of the area T' obtained by accurately correcting the deviation from the area T.

Figures 6A, 6B:
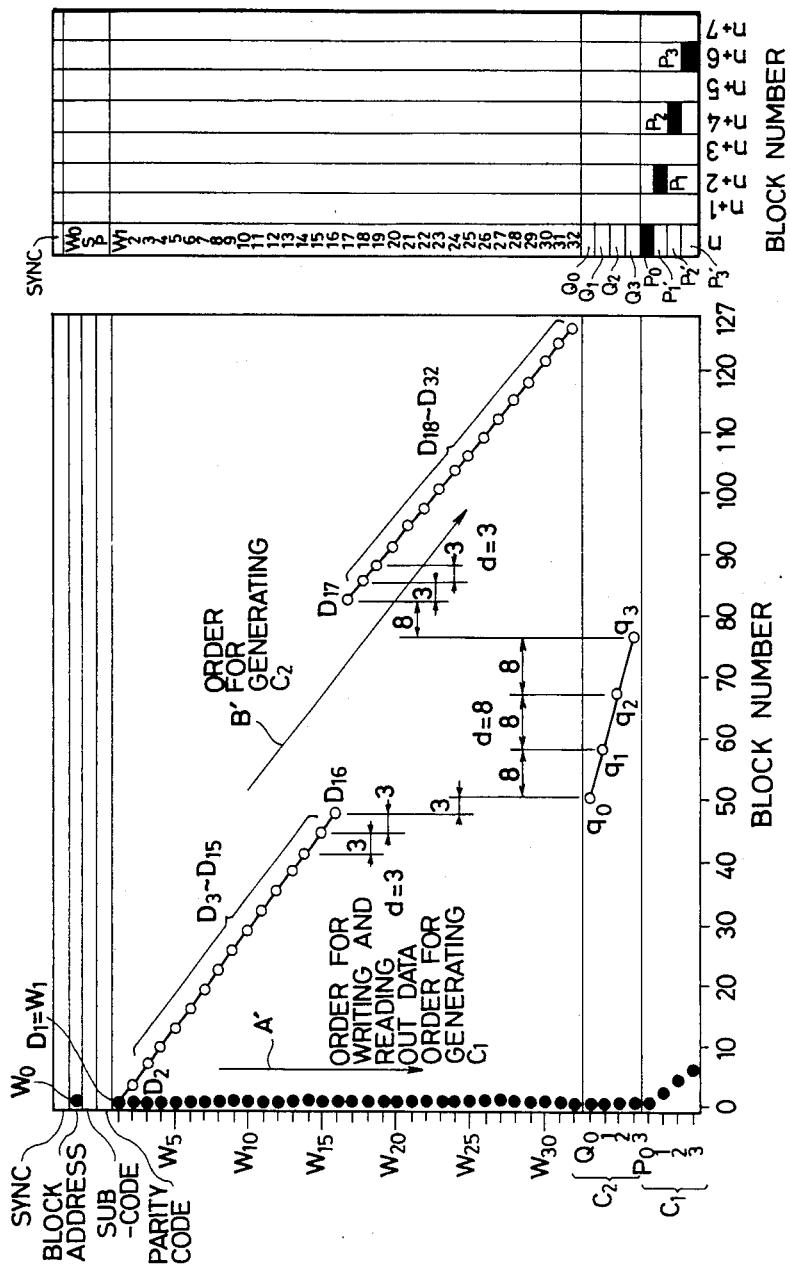
FIGS. 6A and 6B are memory maps of each data, each showing another embodiment of the transmission method of the present invention.

FIGS. 6A and 6B show another embodiment of the present invention. In these drawings, like reference numerals are used to identify like constituents as in FIGS. 4A and 4B. Here, the data $D_1 \sim D_{32}$ for generating the $C_2$ codes has a linear order of generation of $d=3$ as to the data $D_1 \sim D_{16}$ and $D_{17} \sim D_{32}$. The distance of delay blocks of the adjacent $C_2$ codes $q_0$, $q_1$, $q_2$, $q_3$ is $d=8$. Therefore, the distance of delay blocks of the adjacent $C_1$ codes $P_0$, $P_1$, $P_2$, $P_3$ of the four symbols can be made to be $d'=2$. Since the $C_1$ code is completed in the seven blocks in this embodiment, the embodiment exhibits an effect equivalent to that of an apparatus having a circuit construction which secures a six-block length for an after-recording margin.

Figures 7A, 7B:
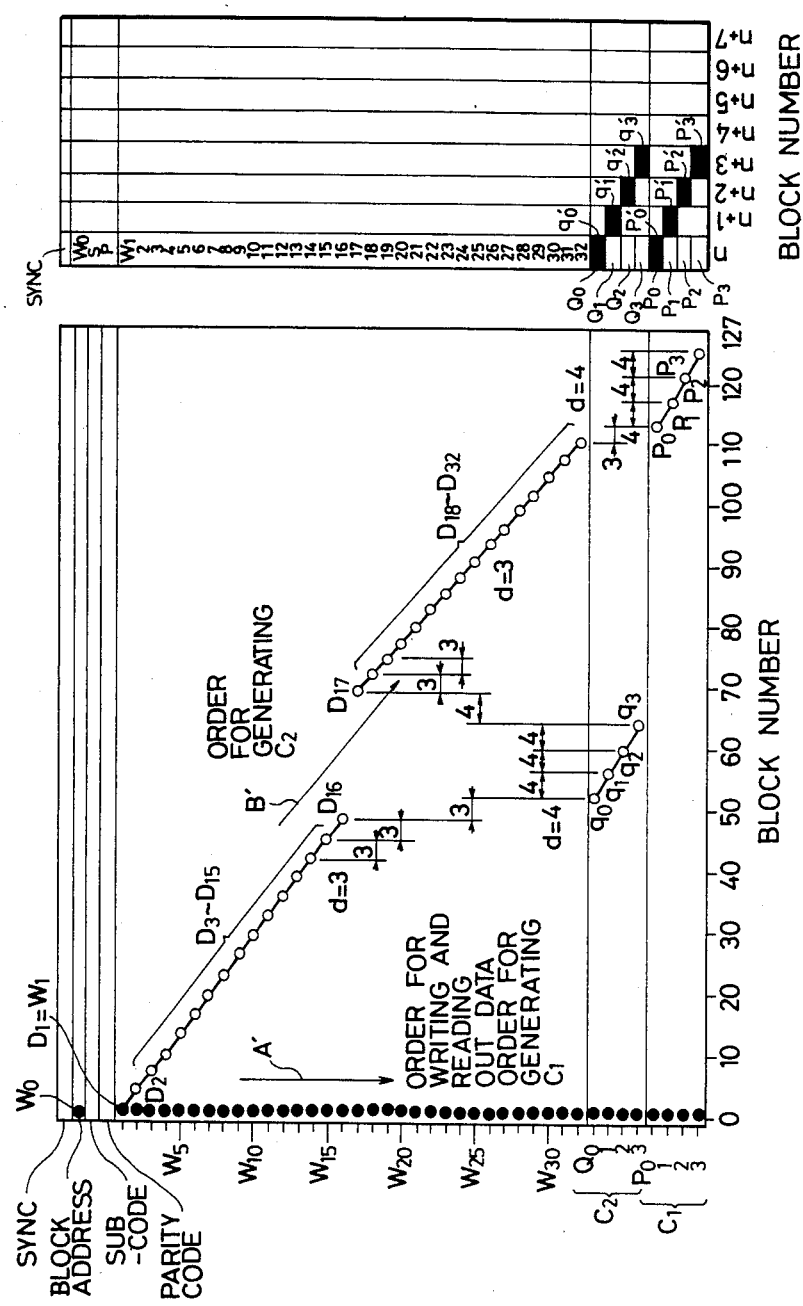
FIGS. 7A and 7B are memory maps of each data, each showing still another embodiment of the transmission method of the present invention.

FIGS. 7A and 7B show still another embodiment of the present invention. In the drawings, like reference numerals are used to identify like constituents as in FIGS. 4A and 4B.

The input time sequence digital data is sequentially stored at positions of black circles $W_1 \sim W_{32}$ on the memory map in the order represented by the arrow A'. Then, the $C_1$ codes $P_0 \sim P_3$ are generated in the order of the arrow A' from 37 data elements consisting of the data elements at the positions of the black circles $W_0 \sim W_{32}$ and the assumed $C_2$ codes $Q_0 \sim Q_3$, and are stored at the positions of the black circles. The $C_2$ codes generate new $C_2$ codes from 37 data elements of $D_1 \sim D_{16}$, $D_{17} \sim D_{32}$ and the $C_1$ codes $P_0 \sim P_3$ at the positions represented by white circles and in the order of the arrow B' in the diagram, and the new $C_2$ codes are stored at the positions of white circles $q_0 \sim q_3$ in the drawing. Here, the distance of delay blocks between adjacent data elements of the data $D_1 \sim D_{16}$ and $D_{17} \sim D_{32}$ for generating the $C_2$ codes is $d=3$, and the distance of delay blocks of the $C_1$ codes $P_0 \sim P_3$ is $d=4$. Furthermore, the distance of delay blocks of the resulting codes $q_0 \sim q_3$ is $d=4$. Among the data thus stored, the $C_2$ codes $Q_0 \sim Q_3$ and the $C_1$ codes $P_0 \sim P_3$ are stored while scrambling them in the distance of delay blocks of $d'=1$ as represented by $q'_0 \sim q'_3$ and $p'_0 \sim p'_3$ in FIG. 7B and then the data read out order for recording them on the magnetic sheet is the order of Sync, Wo, S, P, $W_1 \sim W_{32}$, $Q_0$, $Q_1$, $Q_2$, $Q_3$, $P_0$, $P_1$, $P_2$ and $P_3$ in the nth block in FIG. 7B, for example. As a result, the input PCM data is outputted in time sequence without being interleaved, but nonlinear interleave is applied to the $C_1$ and $C_2$ codes.

Next, an example of a digital signal processing circuit block of a digital signal recording and reproducing apparatus for practising the digital signal transmission method of the present invention will be described with reference to FIGS. 8 and 9.

Figure 8:
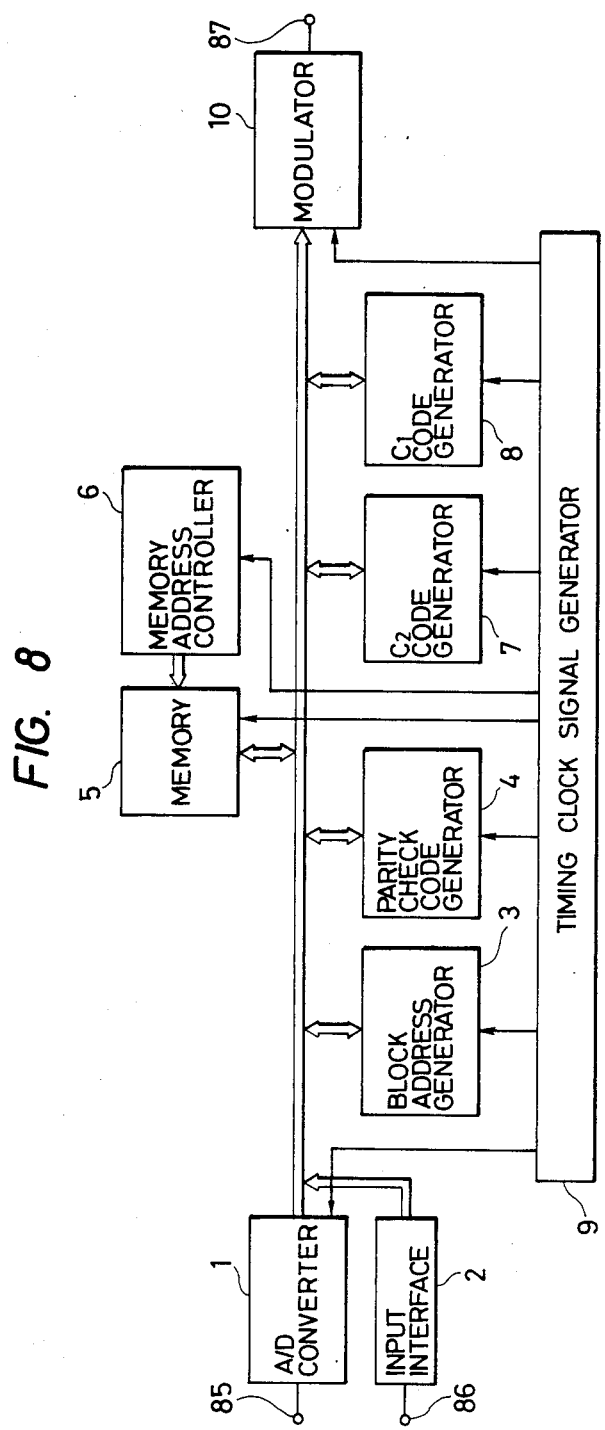
FIG. 8 is a block diagram of a recording circuit of a recording and reproducing apparatus for realizing the transmission method of the present invention.

FIG. 8 is a block diagram of a circuit constituting a recording system. Reference numeral 1 represents an A/D convertor; 2 is an input interface of sub-codes; 3 is a block address generator; 4 is a parity check code generator; 5 is a memory; 6 is a memory address controller; 7 is a $C_2$ code generator; 8 is a $C_1$ code generator; 9 is a timing clock signal generator; and 10 is a modulator. Here, when an analog signal and a sub-code are inputted from input terminals 85 and 86, respectively, the analog signal is converted to a digital signal by the A/D convertor 1, and a block address is generated by the block address generator circuit 3 whenever data that constitutes one block is provided. Furthermore, the parity check code generator 4 generates check codes such as CRC codes, for example, from the resulting block addresses and the sub-codes. The digital signals as the output of the A/D convertor 1 are stored in time sequence in the memory 5, and the $C_2$ and $C_1$ codes are respectively generated by the $C_2$ code generator 7 and the $C_1$ code generator 8 by reading out the data stored in the memory 5, and are then stored in the memory 5.

The data read-out order for generating the $C_2$ and $C_1$ codes or the address of the memory 5 for storing the resulting codes in the memory 5 in this case is controlled by the address controller 6 in such a manner as to satisfy the relation of position shown in FIGS. 4A–4B, 6A–6B or 7A–7B. Furthermore, the data is read out from the memory 5 while controlling the address controller 6 so that the data read-out order from the memory 5 takes the order of the example shown in FIGS. 4B, 6B or 7B. A sync signal is added to the data thus read out by the modulator 10, and digital modulation is applied to the data so as to produce the output signal from the output terminal 87 and to record it on a magnetic recording medium such as a magnetic floppy disk. Incidentally, the timing clock signal generator 9 is one that generates timing clock signals necessary for each of the circuits.

Figure 9:
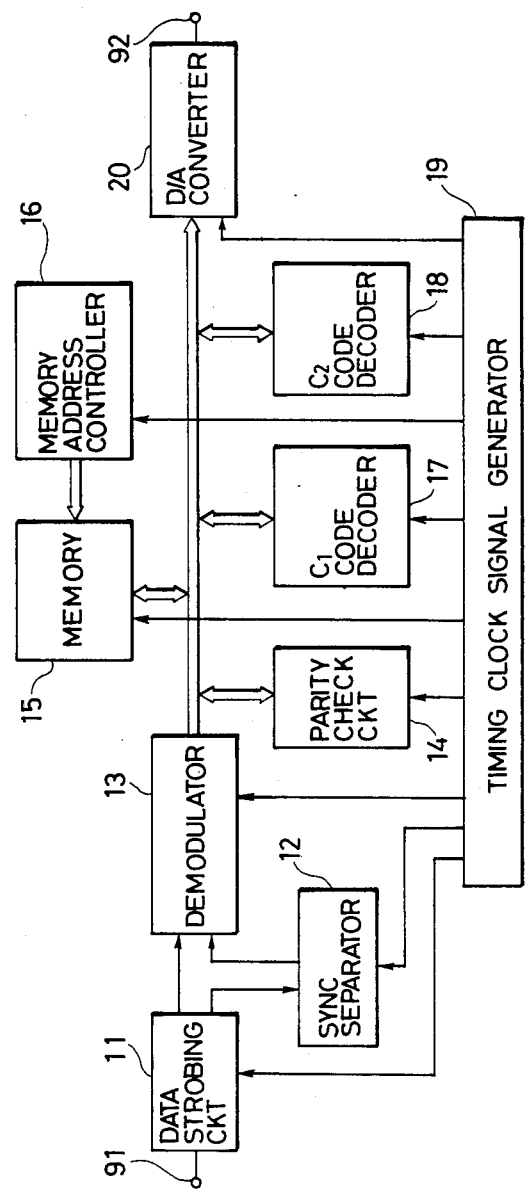
FIG. 9 is a block diagram of a reproducing circuit of the recording and reproducing apparatus for realizing the transmission method of the present invention.

FIG. 9 is a block diagram of circuits constituting a reproducing system of the recording and reproducing apparatus described above. Reference numeral 11 represents a data strobing circuit; 12 is a sync separator; 13 is a demodulator; 14 is a parity check circuit; 15 is a memory; 16 is a memory address controller; 17 is a $C_1$ code decoder; 18 is a $C_2$ code decoder; 19 is a timing clock signal generator; and 20 is a D/A convertor.

In the block diagram, a signal obtained by reproducing the signal recorded on the recording medium is inputted to an input terminal 91, and the logic "1" or "0" of each signal is judged by the data strobing circuit 11 and at the same time, its interval is also judged so as to shape the waveform to a recording modulation waveform of the original rectangular wave. The sync separator 12 detects the sync signal pattern from this rectangular wave pattern and synchronizes it so that the output of the data strobing circuit 11 is digitally demodulated by the demodulator 13 to obtain the original digital signals.

Next, the parity check circuit 14 detects the block address and the code errors of the sub-codes, and after jitter components and the like are absorbed, the demodulated digital data is stored in the memory 15. Furthermore, the $C_1$ codes are decoded by the $C_1$ code decoder 17 by reading out the data stored in the memory 15, and error detection is effected. The $C_2$ codes are decoded by the $C_2$ code decoder 18 in order to detect the error and to correct the error. Thus, the error data stored in the memory 15 is corrected and replaced by the correct data. After the error is corrected, the data is converted to the original analog signals by the D/A convertor 20 and outputted from the output terminal 92. Incidentally, the timing clock signal generator 19 generates the timing waveform or clock signal necessary for each of the circuits described above.

Figure 10:
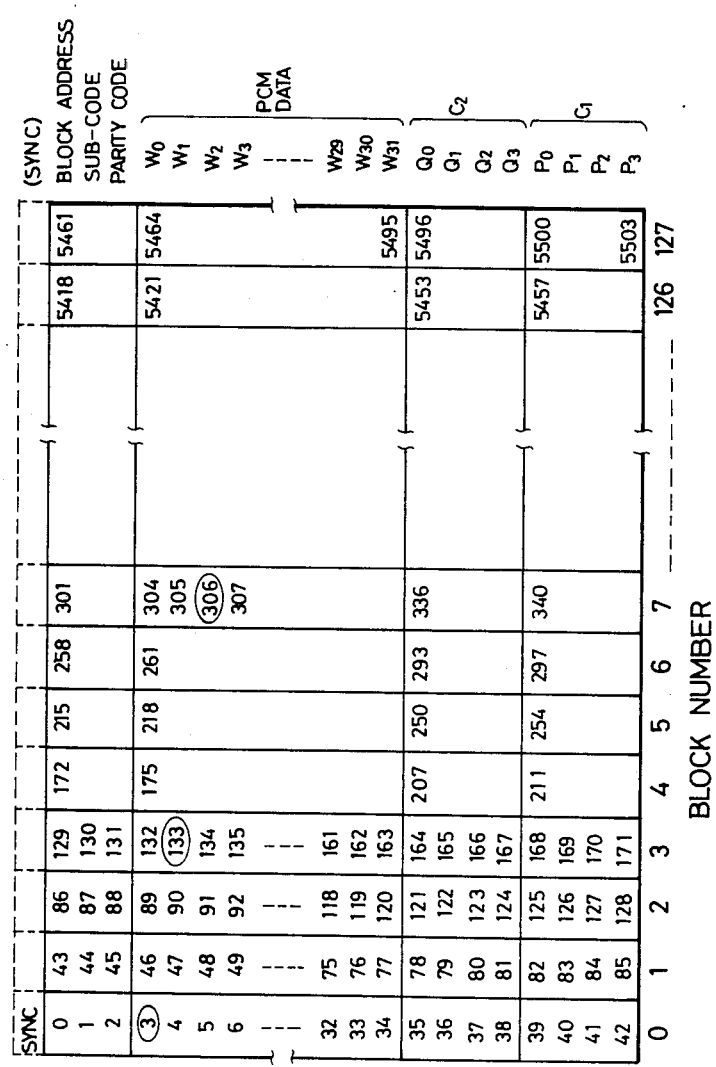
FIG. 10 is a memory map of data showing an example of recording methods utilizing the transmission method of the present invention.
Figure 11:
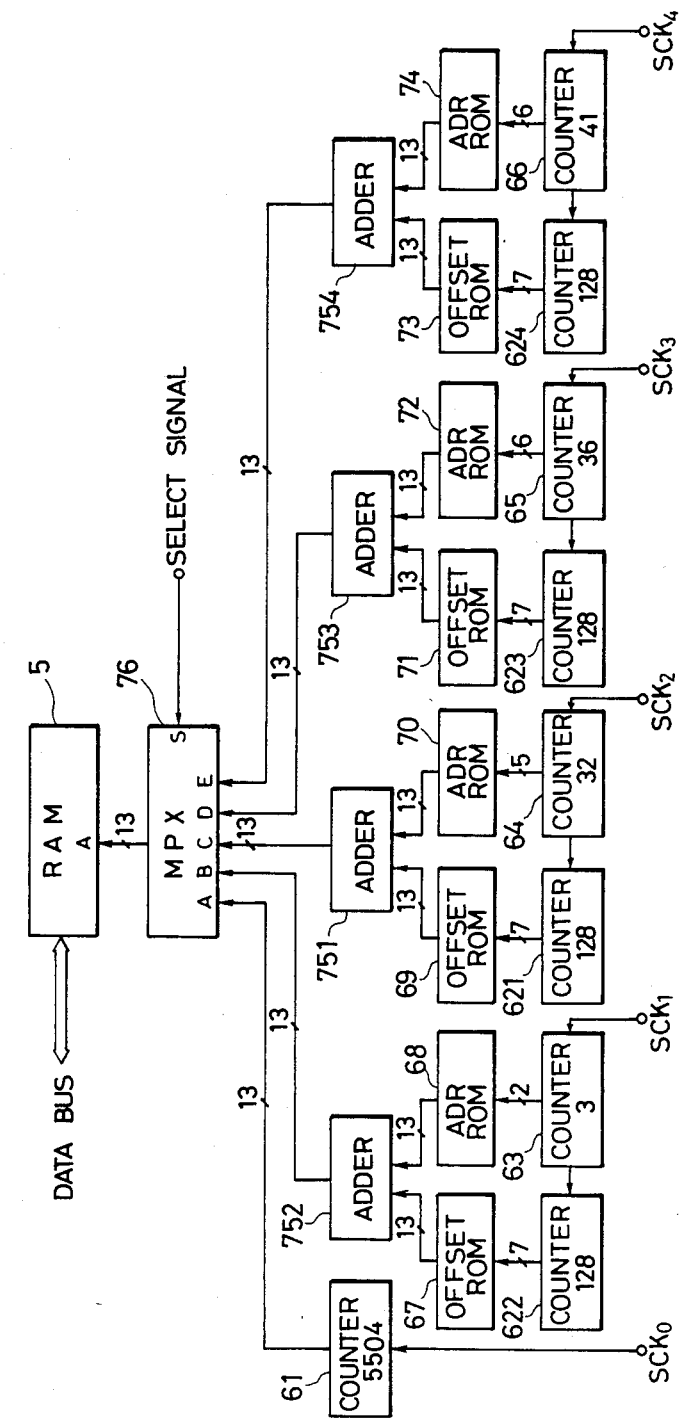
FIG. 11 is a block diagram showing an address control circuit for a memory realizing the recording method which utilizes the transmission method of the present invention.

Next, one example of the address controller 6 of the memory for realizing the interleave operation in accordance with the present invention shown in Fig. 8 and the circuit operation will be described with reference to FIGS. 10 and 11. FIG. 10 is a memory map corresponding to the method in accordance with the present invention shown in FIGS. 4A–4B, and FIG. 11 shows the address controller for generating the memory address. The numerals in the frame in FIG. 10 represent the address for storing each data element. This embodiment shows an example which is designed so that the addresses for reading out the data from the memory can be generated by count-up one by one from 0 in order to record, on the floppy disk, the PCM data, the block address, the sub-codes, the codes $C_1$ and the codes $C_2$ that have been stored in the memory.

Here, the input PCM data is controlled in one frame unit (32 bytes × 128 blocks), and ROMs 69, 70 for generating the address to write the PCM data generate the address so that the addresses sequentially fill the PCM data area in the sequence such as 3, 4, 5 . . . 34, 46, 47, . . . 77, 89 . . . 120, . . . 5495 shown in FIG. 10. In FIG. 11, the ROM for generating the address to write the PCM data is abbreviated to "ADR ROM". ADR ROM 70 outputs 32 address data of 3, 4, 5 . . . , 34 and OFFSET ROM 69 outputs the data of 0, 43, 86, 129 . . . as an offset whenever the block changes. The outputs of these ROMs 69 and 70 are added by an adder 751, thereby generating the address shown in the PCM data area. Incidentally, counters 64 and 621 that designate the address of the ROM are 32-division and 128-division counters, respectively, which count the data number and block number, respectively.

After all the data of one frame is stored in the PCM data area, the block address, the sub-code and the parity code are generated and are sequentially stored at 0, 1, 2, 43, 44, 45, 86 . . . , 5461, . . . , 5462 and 5463 of the address. This operation is realized by reading out 0, 1, 2, 43, 44, 45, . . . from the ROM 68 for generating the address to write the block address, the sub-code and the parity code by the 3-division counter 63 shown in FIG. 11, reading out also 0, 43, 86, 129, . . . from the OFFSET ROM 67 for generating the address to write the block address, the sub-code and the parity code by the block number counter 622 (128-division counter) and adding the read-out data from these ROMs 67 and 68 by the adder 752.

Next, in order to generate the $C_2$ codes, the 32 memory addresses are read out by the ROM 72 for generating the address to read out the data for $C_2$ generation and the address to write the $C_2$ codes and the OFFSET ROM 71 for generating the address to read out the data for $C_2$ generation and the address to write the $C_2$ codes in the order represented by the arrow B' in FIG. 4A, that is, in the order of 3, 133, 306, . . . in FIG. 10, thereby generating the four $C_2$ codes $Q_0$, $Q_1$, $Q_2$ and $Q_3$. Furthermore, the predetermined addresses shown in FIG. 4A are generated by ROMs 71 and 72, and these four $C_2$ codes are stored at these addresses. Finally, the $C_1$ codes are generated by use of the block address, the PCM data and the $C_2$ codes stored in the order described above. In other words, the 41-division counter 66 and the block number counter 624 (128-division counter) drive the ROMs 73 and 74 for generating the address to read the $C_1$ generation data and for generating the address to write the $C_1$ data, respectively, and the outputs of both the ROMs 73 and 74 are added by the adder 754 to generate the predetermined addresses 0, 3, 4, 5, . . . , 37, 38. Using the resulting address, each data element is read out to obtain the four $C_1$ codes $P_0$, $P_1$, $P_2$ and $P_3$. Furthermore, the addresses 39, 83, 127 and 171 are generated by ROMS 73, 74 and the adder 754, and the four $C_1$ codes are stored at these positions. Thus, one frame of data including the check codes is all filled up. At this time, the data is read out from the memory using as such the count values of from 0, 1, 2, . . . , 5504 as the address by the 5504-division counter 61, and is then recorded on the floppy disk, thereby accomplishing the interleave processing of the present invention as shown in FIGS. 4A–4B.

In FIG. 11, symbol MPX 76 represents a 5-input 1-output multiplexor which is switched by a Select signal so as to output the address designated by the timing at which each of the operations described above is effected. The Select signal and the clock signal SCKO–SCK4 necessary for effecting each operation are generated by the timing clock signal generator 9 shown in FIG. 8.

The address generator used in FIG. 11 can be realized by one large capacity ROM. FIG. 12 shows its circuit. Reference numeral 77 represents a counter; 79 is a large capacity ROM or a circuit having a decoder function such as PLA (Programmable Logic Array); and 5 is a memory. Here, the ROM 79 is designed so as to exhibit the operation explained with reference to FIGS. 10 and 11 and to sequentially output the address data. The ROM 79 may have a memory capacity of up to 24.128 k bytes in order to output first the address (13 bits × 32 words × 128 blocks = 53.248 k bits) for storing the PCM data by the counter 77, then the address (13 bits × 3 words × 128 blocks = 4.992 k bits) for storing the block address, the sub-code and the parity code, the address (13 bits × (32+4+4) words × 128 blocks = 66.56 k bits) for reading out the data for generating $C_2$ and for storing the resulting $C_2$ codes and the address (13 bits × (37+4) words × 128 blocks = 68.224 k bits) for reading out the data for generating $C_1$ and for storing the resulting $C_1$ codes. After the predetermined addresses are generated by this ROM 79, the PCM data, the block address, the sub-code, the parity codes, $C_2$ and $C_1$ codes are stored in the memory 5, and one frame of data including the check codes is stored. Thereafter, the address for reading out the data for recording the data on the disk is outputted from the counter 78 (5504-division counter) and changed over the by the multiplexor 80, thereby constituting the address controller of the memory that accomplishes the interleave processing in accordance with the present invention.

In accordance with the embodiments of the invention described above, the digital data that is inputted in time sequence is not interleaved but only the error detection and correction codes are scrambled. When the first error detection and correction codes are block interleave of data, which are completed in n block, the present invention provides the effect which is equivalent to the effect of a circuit and apparatus which add an after-recording margin in the length of an (n−1) block. Since the present invention can thus reduce any adverse influences due to unerased portions, the present invention can eliminate the necessity of the circuit and apparatus which effect recording by particularly adding the after-recording margin.

What is claimed is:

1. A method of transmitting data blocks each consisting of thirty-two digital data elements as frames of one hundred and twenty-eight blocks, in which each frame also includes first and second check codes capable of detecting and correcting errors from different combinations of digital data in the blocks of the frame, said method comprising the steps of:

storing, in a memory having a plurality of block storage areas, thirty-two digital data elements in each block storage area of said memory in the order of generation of said digital data elements;

generating a plurality of sets of second check codes from the digital data stored in the memory in such a manner that each set of the second check codes is generated from thirty-two digital data elements existing alternately at delay block distances between successive elements of three and four blocks in the memory, and storing the second check codes in the memory at positions such that a delay block distance between adjacent second check codes included in each set is alternately three and four blocks;

generating a plurality of sets of first check codes in such a manner that each set of said first check codes is generated from said digital data elements and the second check codes of a respective block storage area in the memory, and storing the second check codes in the memory;

reading out from the memory and transmitting the digital data elements and the first and second check codes in the order of the block storage areas in the memory.

2. A method of transmitting digital data according to claim 1, wherein said first check codes are stored in said memory in positions such that the delay block distance between adjacent first check codes of each set is one block.

* * * * *